United States Patent
Lee et al.

(10) Patent No.: US 9,035,215 B2
(45) Date of Patent: May 19, 2015

(54) LASER IRRADIATION APPARATUS

(75) Inventors: Won-Kyu Lee, Yongin (KR); Jae-Beom Choi, Yongin (KR); Jae-Hwan Oh, Yongin (KR); Young-Jin Chang, Yongin (JP); Seong-Hyun Jin, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 713 days.

(21) Appl. No.: 13/067,611

(22) Filed: Jun. 14, 2011

(65) Prior Publication Data

US 2012/0012568 A1    Jan. 19, 2012

(30) Foreign Application Priority Data

Jul. 16, 2010  (KR) .................. 10-2010-0069154

(51) Int. Cl.
- *B23K 26/00* (2014.01)
- *H01L 21/268* (2006.01)
- *B23K 26/06* (2014.01)

(52) U.S. Cl.
CPC .............. *H01L 21/268* (2013.01); *B23K 26/06* (2013.01)

(58) Field of Classification Search
USPC .......................................... 219/121.6–121.83
See application file for complete search history.

(56) References Cited

U.S. PATENT DOCUMENTS

| | | | | |
|---|---|---|---|---|
| 5,302,798 A | * | 4/1994 | Inagawa et al. ............. | 219/121.7 |
| 5,948,291 A | * | 9/1999 | Neylan et al. ............. | 219/121.77 |
| 6,034,349 A | * | 3/2000 | Ota .......................... | 219/121.73 |
| 6,322,625 B2 | | 11/2001 | Im | |
| 6,590,228 B2 | * | 7/2003 | Voutsas et al. .................. | 257/70 |
| 6,809,013 B2 | * | 10/2004 | Ito ................. | 438/487 |
| 7,098,423 B2 | * | 8/2006 | Masuda et al. ........... | 219/121.82 |
| 7,199,397 B2 | | 4/2007 | Huang et al. | |
| 7,364,952 B2 | * | 4/2008 | Im ................. | 438/150 |
| 7,879,700 B2 | * | 2/2011 | Chung et al. .................. | 438/487 |
| 2005/0045606 A1 | * | 3/2005 | Ito et al. ................. | 219/121.73 |
| 2005/0263506 A1 | | 12/2005 | Masuda et al. | |
| 2006/0148165 A1 | | 7/2006 | Chung et al. | |
| 2007/0042575 A1 | * | 2/2007 | Lee et al. ...................... | 438/488 |

FOREIGN PATENT DOCUMENTS

| | | |
|---|---|---|
| CN | 1754253 A | 3/2006 |
| KR | 10 2004-0061190 A | 7/2004 |
| KR | 10-2005-0054444 A | 6/2005 |

* cited by examiner

*Primary Examiner* — Sang Y Paik

(74) *Attorney, Agent, or Firm* — Lee & Morse, P.C.

(57) ABSTRACT

A laser irradiation apparatus for irradiating a laser beam to a semiconductor layer including a plurality of pixel areas, the apparatus includes a laser generator generating the laser beam, and an optical switching unit time-dividing the laser beam generated from the laser generator and transmitting a plurality of time-divided laser beams to a plurality of optical systems. The apparatus includes a first optical system of the plurality of optical systems that receives a first time-divided laser beam and irradiates a first laser slit beam along a first irradiation direction, and a second optical system of the plurality of optical systems that receives a second time-divided laser beam and irradiates a second laser slit beam along a second irradiation direction that is parallel with the first irradiation direction. The first laser slit beam and the second laser slit beam crystallize partial areas at a same location in the respective pixel areas.

12 Claims, 6 Drawing Sheets

LASER IRRADIATION APPARATUS

BACKGROUND

1. Field

An exemplary embodiment described technology relates generally to a laser irradiation apparatus. More particularly, the described technology relates generally to a laser irradiation apparatus that performs crystallization by irradiating a laser beam to a semiconductor layer.

2. Description of the Related Art

Most flat panel display devices, such as an organic light emitting diode (OLED) display, a liquid crystal display (LCD), and the like, include a thin film transistor. Particularly, a low temperature polycrystalline silicon thin film transistor (LTPS TFT) having good carrier mobility can be applicable to a high speed operational circuit and can be used for a CMOS circuit. As such, the LPTS TFT has been commonly used.

The LTPS TFT includes a polycrystalline silicon film that may be formed by crystallizing an amorphous silicon film. Methods for crystallizing the amorphous silicon film include a solid phase crystallization method, an excimer laser crystallization method, and a crystallization method using a metal catalyst.

Among various crystallization methods, crystallization methods using a laser beam have been widely used because it enables low temperature process so that a thermal effect on a substrate is relatively low and it enables making a polycrystalline silicon layer having a relatively excellent carrier mobility, e.g., as high as over 100 cm2/Vs.

However the crystallization method using laser may require scanning each semiconductor with slit-patterned laser beams. Thus, the crystallization method using laser has a problem in that the throughput per unit hour is significantly decreased compared to other crystallization methods.

The above information disclosed in this section is only for enhancement of understanding of the background of the described technology. Therefore, it may contain information that does not form prior art that is already known in this country to a person of ordinary skill in the art.

SUMMARY

Embodiments are therefore directed to a laser irradiation apparatus, which substantially overcome one or more of the problems due to the limitations and disadvantages of the related art.

It is therefore a feature of an embodiment to provide a laser irradiation apparatus improved in throughput per unit hour.

At least one of the above and other features and advantages may be realized by providing a laser irradiation apparatus according to an exemplary embodiment that irradiates a laser beam to a semiconductor including a plurality of pixel areas. The laser irradiation apparatus includes a laser generator generating the laser beam, a first optical system receiving the laser beam and irradiating a first laser slit beam along a first irradiation direction, a second optical system receiving the laser beam and irradiating a second laser slit beam along a second irradiation direction that is parallel with the first irradiation direction, and an optical switching unit time-dividing the laser beam generated from the laser generator and transmitting the time-divided laser beam to the first optical system and the second optical system. The first laser slit beam and the second laser slit beam crystallize partial areas at the same location in the respective pixel areas.

The first laser slit beam and the second laser slit beam may be irradiated to positions that are separated by predetermined distances along the first and second irradiation directions.

The semiconductor layer may include a first display area and a second display area that are equivalently arranged along the first and second irradiation directions.

Pixel areas of the first display area and pixel areas of the second display area may be equivalently arranged.

The predetermined distances may be smaller than the length of each pixel area in the first and second irradiation directions.

The first laser slit beam and the second laser slit beam may be irradiated to the same positions along the first and second irradiation directions.

The semiconductor layer may include a first display area and a second display area that are arranged to be misaligned to each other by predetermined distances along the first and second irradiation directions.

Pixel areas of the first display area and pixel areas of the second display area may be arranged to be misaligned to each other.

The predetermined distances may be smaller than the length of each pixel in the first and second irradiation directions.

Long axes of the first and second laser slit beams may respectively cross the first and second irradiation directions.

The laser irradiation apparatus may further include at least one of additional optical systems. The optical switching unit may time-divide the laser beam generated from the laser generator and may transmit the time-divided laser beam to the first, second, and the additional optical systems.

The additional optical system may irradiate an additional laser slit beam along an irradiation direction that is parallel with the first irradiation direction.

According to the exemplary embodiments, the laser irradiation apparatus may improve the throughput per unit hour.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
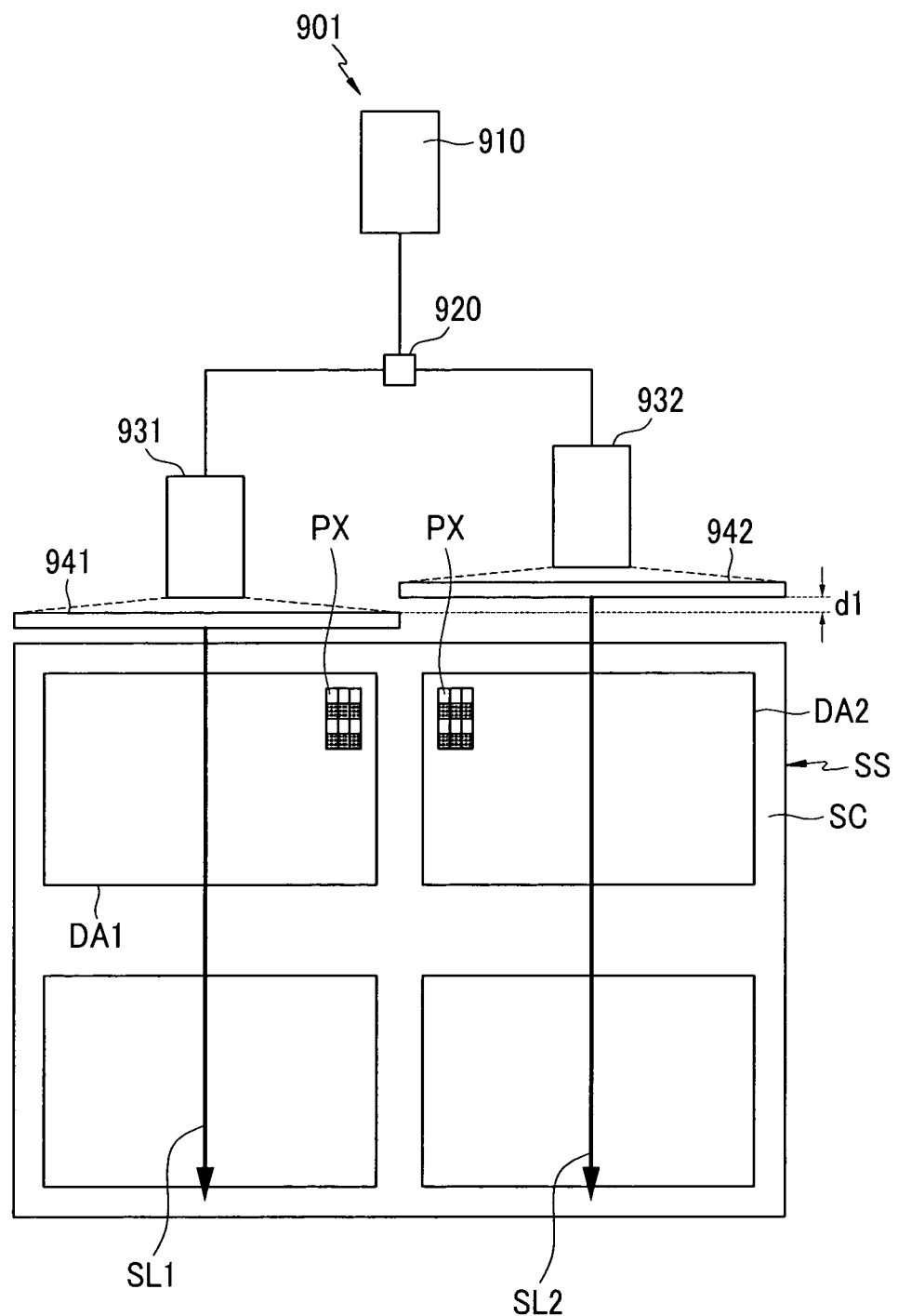
FIG. 1 illustrates a schematic diagram of a laser irradiation apparatus according to an exemplary embodiment.

Korean Patent Application No. 10-2010-0069154, filed on Jul. 16, 2010, in the Korean Intellectual Property Office, and entitled: "Laser Irradiation Apparatus," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art. As those skilled in the art would realize, the described embodiments may be modified in various different ways, all without departing from the spirit or scope of the present invention.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout. Furthermore, as the size and thickness of the respective structural components shown in the drawings are arbitrarily illustrated for explanatory convenience, the embodiments are not necessarily limited to the illustrated.

Constituent elements having the same structures throughout the embodiments are denoted by the same reference numerals and are described in a first exemplary embodiment. In the subsequent exemplary embodiments, only the constituent elements other than the same constituent elements are described.

Hereinafter, a laser irradiation apparatus 901 according to an exemplary embodiment will be described with reference to FIG. 1 and FIG. 2.

Figure 2:
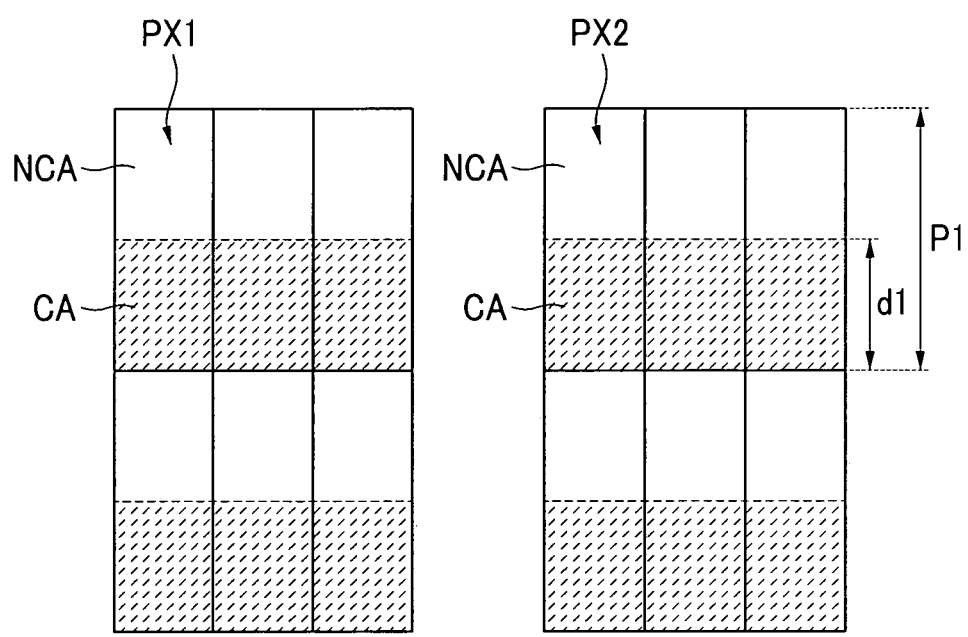
FIG. 2 illustrates a top plan view of pixel areas crystallized by a laser irradiation apparatus of FIG. 1.

As shown in FIG. 1, the laser irradiation apparatus 901 includes a laser generator 910, an optical switching unit 920, first optical system 931, and a second optical system 932. The laser generator 910 generates layer light to be used for, e.g., crystallization. The laser irradiation apparatus 901 crystallizes a semiconductor layer SC including a plurality of pixel areas PX by irradiating the laser beam thereto.

In addition, the laser irradiation apparatus 901 may further include a transfer unit (not shown) that transfers a substrate SS including the semiconductor layer SC thereon or the first and second optical systems 931 and 932. The transfer unit transfers the substrate SS including the semiconductor layer SC or the first and second optical systems 931 and 932 to a first irradiation direction SL1 and/or a second irradiation direction SL2. In an exemplary embodiment, the second irradiation direction SL2 is parallel with the first irradiation direction SL1 in the same direction. Thus, the laser irradiation apparatus 901 can scan-irradiate the semiconductor layer SC along the first irradiation direction SL1 and the second irradiation direction SL2.

The semiconductor layer SC is divided into at least a first display area DA1 and a second display area DA2. The first display area DA1 and the second display area DA2 may each be arranged in the same direction along the first and second irradiation directions SL1 and SL2. In addition, pixel areas PX of the first display area DA1 and pixel areas PX of the second display area DA2 may be equivalently arranged, e.g., symmetrically arranged with respect to an axis of the substrate SS.

The optical switching unit 920 time-divides the laser beam generated from the laser generator 910 and then transmits the time-divided laser beam to the first and second optical systems 931 and 932 through time-division. For example, when a time for scan-irradiating a single pixel area with the laser beam generated from the laser generator 910 is one period, the optical switching unit 920 transmits the laser beam to the first optical system 931 first during a ½ period and then transmits the laser beam to the second optical system 932 during the other ½ period.

The first optical system 931 converts the laser beam to a first laser slit beam 941. In addition, the first optical system 931 irradiates the first laser slit beam 941 along the first irradiation direction SL1. The second optical system 932 converts the layer beam to a second laser slit beam 942, and irradiates the second laser slit beam 942 along the second irradiation direction SL2. Since the first irradiation direction SL1 and the second irradiation direction SL2 are parallel with each other in the same direction, the first laser slit beam 941 and the second laser slit beam 942 may be irradiated in parallel with each other along the same direction. In addition, longer axes of the first laser slit beam 941 and the second laser slit beam 942 may cross, e.g., may be perpendicular to, respective first and second irradiation directions SL1 and SL2.

In an exemplary embodiment, the laser irradiation apparatus 901 irradiates the first laser slit beam 941 and the second laser slit beam 942 to positions having a predetermined distance d1, e.g., along the first and second irradiation directions SL1 and SL2. As shown in FIG. 2, the predetermined distance d1 may be smaller than a length p1 of the each pixel PX in the first irradiation direction SL1 and the second irradiation direction SL2. The first and second slit beams 941 and 942 may crystallize the same spot in each pixel PX when the predetermined distance d1 is set to be smaller than the length p1 of each pixel PX in the first and second irradiation directions SL1 and SL2.

In further detail, the first laser slit beam 941 may be irradiated to a position that is ahead or behind of a position where the second laser slit beam 942 is irradiated with reference to the first and second irradiation directions SL1 and SL2. For example, the first laser slit beam 941 may be irradiated to a position that is ahead or behind the second laser slit beam 942 by, e.g., the predetermined distance d1.

The laser beam generated from the laser generator 910 is transmitted to the first optical system 931 through the optical switching unit 920. The first laser slit beam 941 irradiated from the first optical system 931 crystallizes a part of the pixel area PX in the first display area DA1, that is, a crystallization area CA of the first pixel area PX1 shown in FIG. 2 is formed by the first laser slit beam 941. When the optical switching unit 920 transmits the laser beam to the second optical system 932, the second laser slit beam 942 irradiated from the second optical system 932 crystallizes a part of the pixel area PX in the second display area DA2, that is, a crystallization area CA of the second pixel area PX2 shown in FIG. 2 is formed by the second laser slit beam 942. The crystallization areas CA in each display area DA1 and DA2 are separated from each other by non-crystallization areas NCA to form, e.g., the same repeating pattern of crystallization areas CA and non-crystallization areas NCA on pixels of each of the display areas DA1 and DA2. The substrate SS where the semiconductor layer SC is formed or the first and second optical systems 931 and 932 may be transferred along the first irradiation direction SL1 and the second irradiation direction SL2 by the transfer unit (not shown).

Thus, while not being irradiated simultaneously, the first laser slit beam 941 and the second laser slit beam 942 may crystallize a part of each pixel area PX, e.g., to form the crystallization area CA, at the same location in each of the plurality of pixel areas PX.

In one pixel area PX, the crystallization area CA may be used as, e.g., a semiconductor layer of a thin film transistor. In addition, e.g., an organic light emitting element and the like may be disposed in the non-crystallization area NCA. A capacitor may be formed in the crystallization area CA or may be formed in the non-crystallization area NCA.

The laser irradiation apparatus 901 according to an exemplary embodiment may crystallize a part, i.e., crystallization area CA, of one pixel area PX, rather than crystallizing the entire area of the pixel area PX by irradiating the laser slit beams 941 and 942. In addition, the laser irradiation apparatus 901 may crystallize the plurality of display areas DA1 and DA2 together with one laser generator 910. Thus, the laser irradiation apparatus 901 may effectively improve the throughput per unit hour.

In addition, since the first and second slit beams 941 and 942 crystallize the part CA at the same location in each pixel area PX, the process after crystallization may be simplified. When the crystallized areas of the plurality of pixel areas PX are different from each other, e.g., placed at different locations in each pixel, each of the display areas DA1 and DA2 may require individual design or additional processes.

Hereinafter, a laser irradiation apparatus 902 according to an exemplary embodiment will be described with reference to FIG. 3 and FIG. 4.

Figure 3:
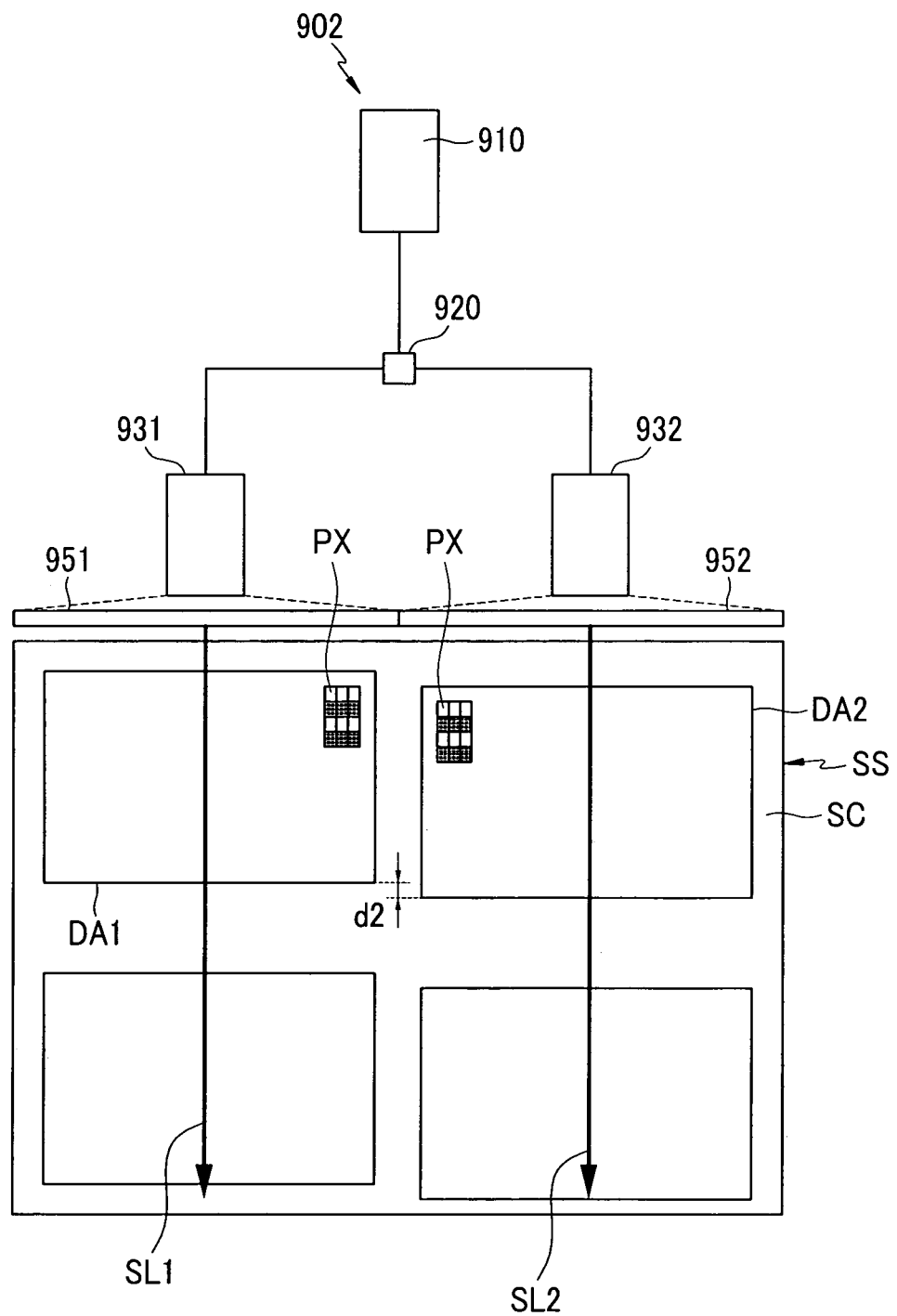
FIG. 3 illustrates a schematic diagram of a laser irradiation apparatus according to an exemplary embodiment.

As shown in FIG. 3, the laser irradiation apparatus 902 includes a laser generator 910, an optical switching unit 920, a first optical system 931, and a second optical system 932. In addition, the laser irradiation apparatus 902 may further include the transfer unit (not shown).

A semiconductor layer SC is divided into a first display area DA1 and a second display area DA2. The first display area DA1 and the second display area DA2 are misaligned in first and second irradiation directions SL1 and SL2 by a predetermined distance d2. As shown in FIG. 4, the predetermined distance d2 is smaller than a length P2 of each pixel area PX. The predetermined distance d2 may be parallel with the first irradiation direction SL1, and the length P2 may be parallel with the second irradiation direction SL2. The length P2 of the pixel area PX may be parallel with the first irradiation direction SL1. The first irradiation directional length P2 of the pixel area may correspond to the length of a long axis of the pixel area PX, but the second exemplary embodiment is not limited thereto. For example, the first irradiation directional length P2 of the pixel area PX may be the length of a short axis of pixel area PX. In addition, the second irradiation directional length P2 of the pixel area PX may likewise, e.g., correspond to the length of a long axis of the pixel area, have similar properties as the first irradiation directional length P2.

Figure 4:
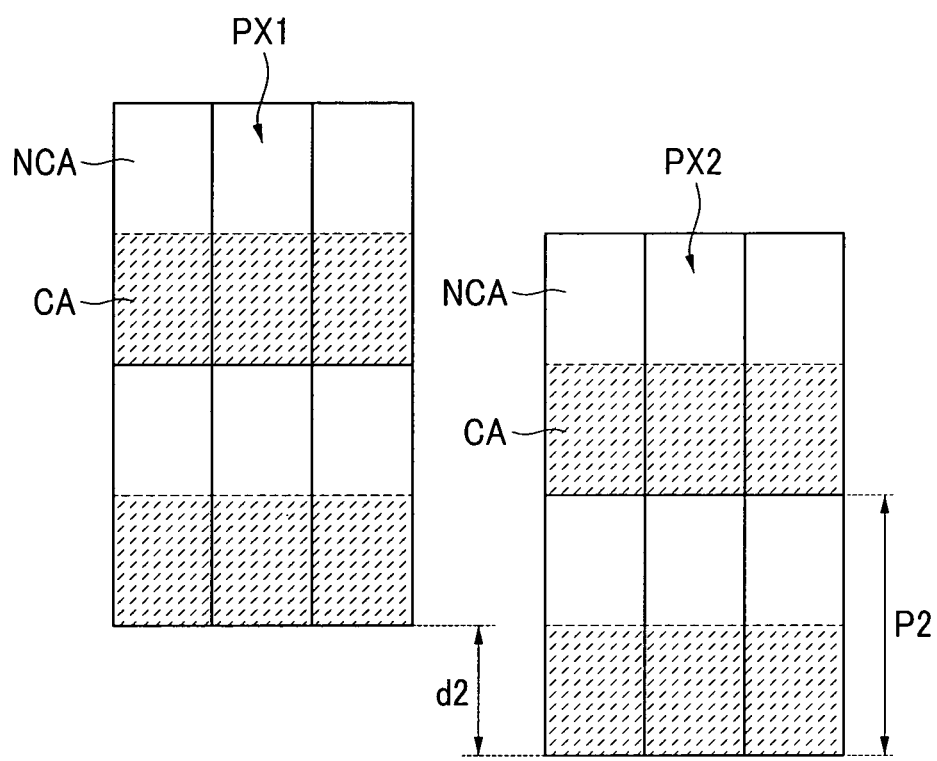
FIG. 4 illustrates a top plan view of pixel areas crystallized by a laser irradiation apparatus of FIG. 3.

As shown in FIG. 4, pixel areas PX of the first display area DA1 and pixel areas PX of the second display area DA2 may be misaligned with respect each other, e.g., the pixel areas may be offset from each other with respect to an axis of the substrate SS. For example, the first display area DA1 may be offset from the second display area DA2 by the predetermined distance d2. First and second laser slit beams 951 and 952 may crystallize parts at the same locations in the respective pixel areas PX of the first and second display areas DA1 and DA2 when the predetermined distance d2 is set to be smaller than the irradiation directional length P2 of the pixel areas PX.

Referring to FIG. 3, the optical switching unit 920 may time-divide laser beams generated from the laser generator 910 and may transmit the time-divided laser beams to the first optical system 931 and the second optical system 932.

The first optical system 931 and the second optical system 932 convert the laser beams to a first laser slit beam 951 and a second laser slit beam 952, respectively. Then, the first and second optical systems 931 and 932 irradiate the first and second laser slit beams 951 and 952 along the first and second irradiation directions SL1 and SL2, respectively.

In the exemplary embodiment, the laser irradiation apparatus 902 irradiates the first and second laser slit beams 951 and 952 to the same locations along the respective first and second irradiation directions SL1 and SL2.

The first optical system 931 received first the laser beam through the optical switching unit 920 irradiates the first optical system 931 to crystallize a part of the pixel area PX in the first display area DA1, that is, a crystallization area CA of a first pixel area PX1 shown in FIG. 4. When the optical switching unit 920 transmits the laser beam to the second optical system 932, the second optical system 932 crystallizes a part of the pixel area PX of the second display area DA2, that is, a crystallization area CA of a second pixel area PX2 shown in FIG. 4. In this case, the substrate SS where the semiconductor layer SC is formed or the first and second optical systems 931 and 932 are transferred toward the first and second irradiation directions SL1 and SL2 by the transfer unit (not shown).

Since the first display area DA1 and the second display area DA2 are misaligned with respect to each other, e.g., by the predetermined distance d2, the first laser slit beam 951 and the second laser slit beam 952 may crystallize parts of the respective pixel areas PX at the same locations even though the first and second laser slit beams 951 and 952 are alternately irradiated.

When the cutting process is performed with reference to the first and second display areas DA1 and DA2, the first display area DA1 and the second display area DA2 may respectively include a plurality of pixel areas PX including the crystallization area CA and the non-crystallization area NCA arranged in a same pattern, e.g., an alternating pattern.

As described, the first laser slit beam 951 and the second laser slit beam 952 irradiated through the first optical system 931 and the second optical system 932, respectively, crystallize the crystallization areas CA at the same locations in the respective pixel areas PX without being simultaneously irradiated.

The laser irradiation apparatus 902 according to the exemplary embodiment irradiates the laser slit beams 951 and 952 to crystallize only a part (i.e., the crystallization area CA) in each pixel area rather than crystallizing the entire area of the pixel area. The laser irradiation apparatus 902 may crystallize the plurality of display areas DA1 and DA2 together with one laser generator 910. Accordingly, the laser irradiation apparatus 902 may effectively improve the throughput per unit hour.

In addition, since the first and second laser slit beams 951 and 952 may crystallize areas at the same location in each pixel area, the process performed after the crystallization may be simplified.

Hereinafter, laser irradiation apparatuses 903 and 904 according to an exemplary embodiments will be described with reference to FIG. 5 and FIG. 6.

Figure 5:
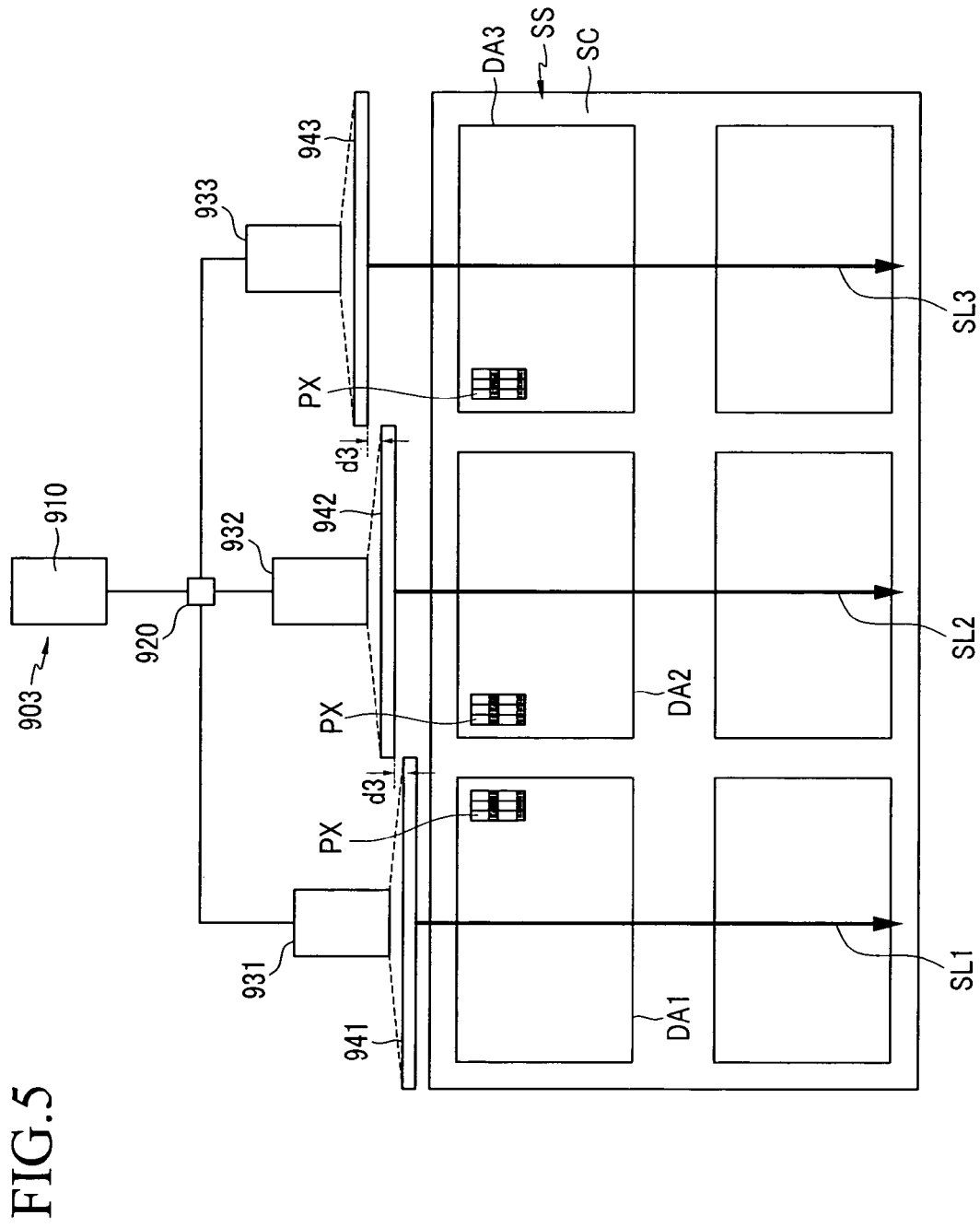
FIG. 5 illustrates a schematic diagram of a laser irradiation apparatus according to an exemplary embodiment.

As shown in FIG. 5, the laser irradiation apparatus 903 according to an exemplary embodiment includes the constituent elements of the laser irradiation apparatus 901, and further includes an optical system 933. As shown in FIG. 6, the laser irradiation apparatus 904 includes the constituent elements of the laser irradiation apparatus 902, and further includes an optical system 933. In particular, in an exemplary embodiment, one or more additional optical systems 933 may be provided. An optical switching unit 920 time-divides laser beams and transmits the time-divided laser beams to the first optical system 931, the second optical system 932, and the additional optical system 933. Further, the additional optical systems 933 shown in FIGS. 5 and 6 may irradiate additional laser slit beams 943 and 953. The additional laser slit beams 943 and 953 may be irradiated along an additional irradiation direction SL3. The additional irradiation direction SL3 may be parallel with the first irradiation direction SL1 and/or second irradiation direction SL2. A semiconductor layer SC may be divided into a first display area DA1, a second display area DA2, and an additional display area DA3.

As shown in FIG. 5, the laser irradiation apparatus 903 according to the exemplary embodiment irradiates the first laser slit beam 941, the second laser slit beam 942, and the additional laser slit beam 943 at positions respectively separated by a predetermined distance d3. The predetermined distance d3 is set to be smaller than the length of each pixel area PX in the irradiation directions SL1, SL2, and SL3.

Figure 6:
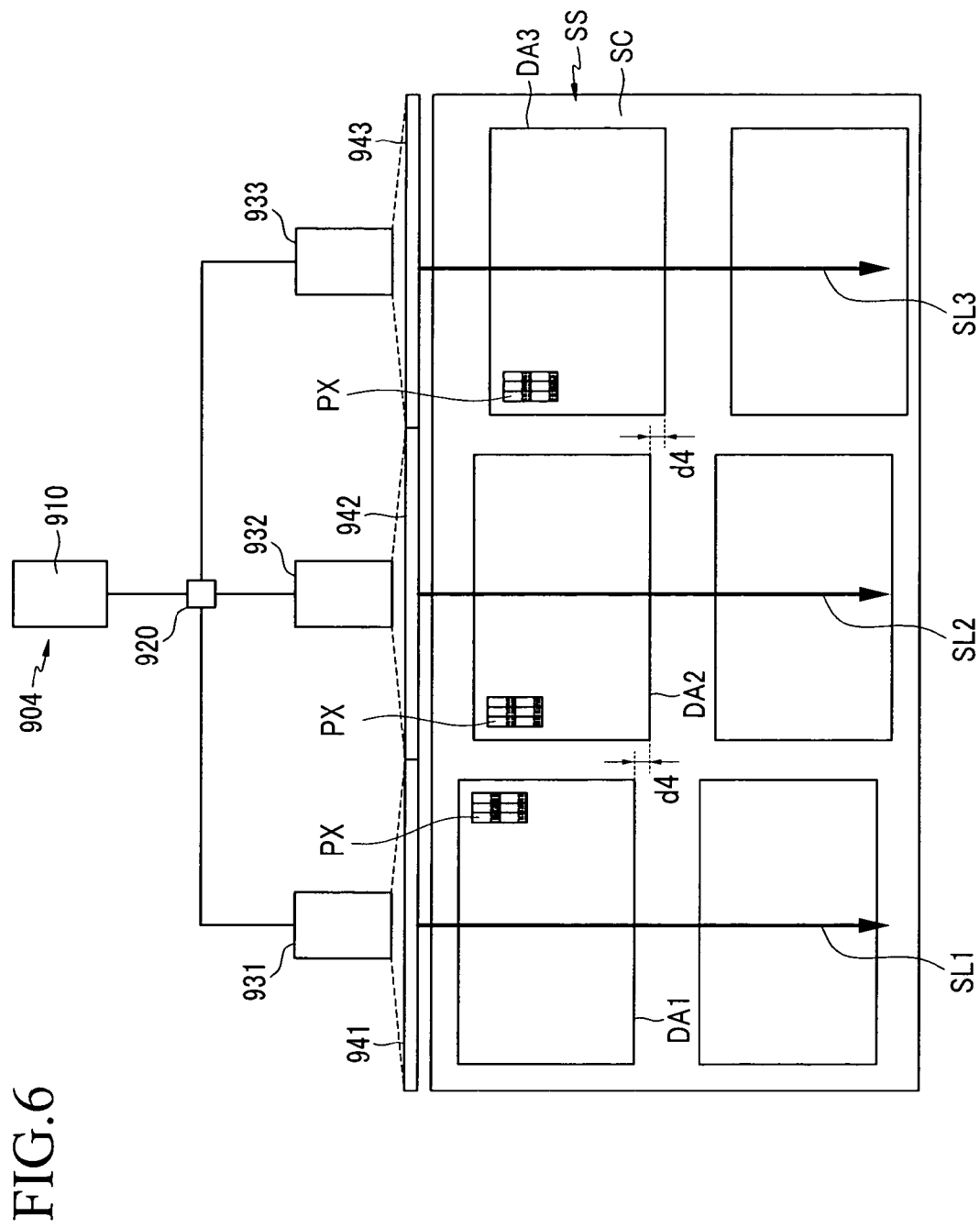
FIG. 6 illustrates a schematic diagram of a laser irradiation apparatus according to an exemplary embodiment.

As shown in FIG. 6, a first display area DA1, a second display area DA2, a third display area D3, and a fourth display area D4 are arranged to be misaligned to each other by a predetermined distance d4 along the first irradiation direction SL1, the second irradiation direction SL2, and the additional irradiation direction SL3. The predetermined distance d4 is smaller than the length of each pixel PX in the irradiation directions SL1, SL2, and SL3. In addition, pixel areas PX of the first display area DA1 and pixel areas of the second display area DA2 are arranged to be misaligned with respect to each other.

The laser irradiation apparatuses 903 and 904 may effectively work with three or more optical systems 931, 932, and 933.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A laser irradiation apparatus for irradiating a laser beam to a semiconductor layer including a plurality of pixel areas, comprising:
   a laser generator generating the laser beam; and
   an optical switching unit time-dividing the laser beam generated from the laser generator and transmitting a plurality of time-divided laser beams to a plurality of optical systems, wherein:
      a first optical system of the plurality of optical systems receives a first time-divided laser beam and irradiates a first laser slit beam along a first irradiation direction,
      a second optical system of the plurality of optical systems receives a second time-divided laser beam and irradiates a second laser slit beam along a second irradiation direction that is parallel with the first irradiation direction,
      the first laser slit beam and the second laser slit beam are configured to crystallize partial areas at a same location in the respective pixel areas, and
      the first and second optical systems are configured such that the first laser slit beam and the second laser slit beam, respectively:
         are irradiated to positions that are separated by a predetermined distance along the first and second irradiation directions, or
         are irradiated to a first display area and a second display area of the semiconductor layer, respectively, that are misaligned by the predetermined distance along the first and second irradiation directions, the predetermined distance being smaller than a length of each pixel area in the first and second irradiation directions, and
   wherein a time difference between the first time-divided laser beam of the first optical system and the second time-divided laser beam of the second optical system is adjusted in accordance with the predetermined distance.

2. The laser irradiation apparatus as claimed in claim 1, wherein the first and second laser beams are configured to be irradiated to a first display area and a second display area on the semiconductor layer, respectfully, that are equivalently arranged along the first and second irradiation directions.

3. The laser irradiation apparatus as claimed in claim 2, wherein the pixel areas of the first display area and pixel areas of the second display area are equivalently arranged.

4. The laser irradiation apparatus as claimed in claim 1, wherein the first laser slit beam and the second laser slit beam are configured to be irradiated to the same positions along the first and second irradiation directions.

5. The laser irradiation apparatus as claimed in claim 4, wherein the first and second optical systems are configured such that the respective first and second laser beams are irradiated to the first display area and the second display area of the semiconductor layer, respectively, that are misaligned by the predetermined distance along the first and second irradiation directions.

6. The laser irradiation apparatus as claimed in claim 5, wherein pixel areas of the first display area and pixel areas of the second display area are arranged to be misaligned to each other.

7. The laser irradiation apparatus as claimed in claim 1, wherein long axes of the first and second laser slit beams are arranged to cross the first and second irradiation directions, respectively.

8. The laser irradiation apparatus of any one as claimed in claims 1, 2, 3, 4-6, and 7, further comprising at least one additional optical system, and the optical switching unit time-divides the laser beam generated from the laser generator and transmits additional laser slit beams to the at least one additional optical system.

9. The laser irradiation apparatus as claimed in claim 8, wherein the at least one additional optical system irradiates an additional laser slit beam along an irradiation direction that is parallel with the first irradiation direction.

10. The laser irradiation apparatus as claimed in claim 1, wherein the first laser slit beam and the second laser slit beam crystallize partial areas of respective pixel areas that are aligned with each other.

11. The laser irradiation apparatus as claimed in claim 10, wherein the predetermined distance and the time difference between the first time-divided laser beam and the second time-divided laser beam of the second optical system are adjusted to provide aligned crystallized respective pixel areas.

12. The laser irradiation apparatus as claimed in claim 1, wherein the first time-divided laser beam of the first optical system is irradiated before the second time-divided laser beam of the second optical system by a first time difference, the first time difference being compensated by the predetermined distance to provide aligned crystallized respective pixels.

\* \* \* \* \*